United States Patent
Huemoeller et al.

(10) Patent No.: US 9,324,614 B1
(45) Date of Patent: Apr. 26, 2016

(54) THROUGH VIA NUB REVEAL METHOD AND STRUCTURE

(71) Applicant: Amkor Technology, Inc., Chandler, AZ (US)

(72) Inventors: Ronald Patrick Huemoeller, Gilbert, AZ (US); Frederick Evans Reed, Raleigh, NC (US); David Jon Hiner, Chandler, AZ (US); Kiwook Lee, Seoul (KR)

(73) Assignee: AMKOR TECHNOLOGY, INC.

( * ) Notice: Subject to any disclaimer, the term of this patent is extended or adjusted under 35 U.S.C. 154(b) by 112 days.

(21) Appl. No.: 13/663,208

(22) Filed: Oct. 29, 2012

Related U.S. Application Data (62) Division of application No. 12/754,837, filed on Apr. 6, 2010, now Pat. No. 8,324,511.

(51) Int. Cl.
| | | |
|---|---|---|
| H01L 21/78 | (2006.01) | |
| H05K 3/42 | (2006.01) | |
| H05K 3/40 | (2006.01) | |

(52) U.S. Cl.
CPC .............. *H01L 21/78* (2013.01); *H05K 3/4038* (2013.01); *H05K 3/42* (2013.01); *Y10T 29/49165* (2015.01); *Y10T 29/49204* (2015.01)

(58) Field of Classification Search
CPC .................................. H05K 3/421; H05K 3/42
USPC ..................... 29/846, 852; 174/255, 260–266; 361/760, 767, 772, 777, 780, 794, 795; 257/700, 778, 782, 784, 797; 438/113
See application file for complete search history.

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |

(Continued)

FOREIGN PATENT DOCUMENTS

| | | |
|---|---|---|
| DE | 197 34 794 | 7/1998 |
| EP | 0 393 997 | 10/1990 |

(Continued)

OTHER PUBLICATIONS

Hiner et al., "Through Via Recessed Reveal Structure and Method," U.S. Appl. No. 13/756,167, filed Jan. 31, 2013.

(Continued)

*Primary Examiner* — Peter DungBa Vo
*Assistant Examiner* — Kaying Kue
(74) *Attorney, Agent, or Firm* — McAndrews, Held & Malloy, Ltd.

(57) ABSTRACT

A method includes applying a backside passivation layer to an inactive surface of an electronic component and to enclose a through via nub protruding from the inactive surface. The method further includes laser ablating the backside passivation layer to reveal a portion of the through via nub. The backside passivation layer is formed of a low cost organic material. Further, by using a laser ablation process, the backside passivation layer is removed in a controlled manner to reveal the portion of the through via nub. Further, by using a laser ablation process, the resulting thickness of the backside passivation layer is set to a desired value in a controlled manner. Further, by using a laser ablation process, the fabrication cost is reduced as compared to the use of chemical mechanical polish.

10 Claims, 6 Drawing Sheets

(56) References Cited

U.S. PATENT DOCUMENTS

| | | | |
|---|---|---|---|
| 3,837,074 A * | 9/1974 | Griff | H01B 11/18 174/253 |
| 3,838,984 A | 10/1974 | Crane et al. | |
| 4,054,238 A | 10/1977 | Lloyd et al. | |
| 4,189,342 A | 2/1980 | Kock | |
| 4,249,302 A * | 2/1981 | Crepeau | H05K 3/368 216/18 |
| 4,258,381 A | 3/1981 | Inaba | |
| 4,283,243 A * | 8/1981 | Andreades | G03F 7/168 156/237 |
| 4,289,922 A | 9/1981 | Devlin | |
| 4,301,464 A | 11/1981 | Otsuki et al. | |
| 4,312,897 A * | 1/1982 | Reimann | H05K 1/0265 205/125 |
| 4,325,780 A * | 4/1982 | Schulz, Sr. | H05K 3/427 174/266 |
| 4,332,537 A | 6/1982 | Slepcevic | |
| 4,394,712 A | 7/1983 | Anthony | |
| 4,417,266 A | 11/1983 | Grabbe | |
| 4,451,224 A | 5/1984 | Harding | |
| 4,499,655 A | 2/1985 | Anthony | |
| 4,529,477 A * | 7/1985 | Lundberg | H05K 3/0094 216/17 |
| 4,530,152 A | 7/1985 | Roche et al. | |
| 4,541,003 A | 9/1985 | Otsuka et al. | |
| 4,608,274 A * | 8/1986 | Wooten | H05K 3/243 216/105 |
| 4,610,756 A * | 9/1986 | Strobel | H05K 1/116 174/257 |
| 4,646,710 A | 3/1987 | Schmid et al. | |
| 4,671,854 A * | 6/1987 | Ishikawa | G03F 7/004 216/18 |
| 4,673,458 A * | 6/1987 | Ishikawa | G03F 7/164 216/18 |
| 4,707,724 A | 11/1987 | Suzuki et al. | |
| 4,720,324 A * | 1/1988 | Hayward | H05K 3/062 205/166 |
| 4,727,633 A | 3/1988 | Herrick | |
| 4,729,061 A | 3/1988 | Brown | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Schlesinger et al. | |
| 5,018,003 A | 5/1991 | Yasunaga et al. | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson | |
| 5,118,298 A | 6/1992 | Murphy | |
| 5,122,860 A | 6/1992 | Kikuchi et al. | |
| 5,134,773 A | 8/1992 | LeMaire et al. | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, 3rd et al. | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,229,647 A | 7/1993 | Gnadinger | |
| 5,245,751 A * | 9/1993 | Locke | H01L 21/486 257/E23.067 |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,268,310 A | 12/1993 | Goodrich et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A | 1/1994 | Singh Deo et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,353,498 A | 10/1994 | Fillion et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,394,303 A | 2/1995 | Yamaji | |
| 5,406,124 A | 4/1995 | Morita et al. | |
| 5,410,180 A | 4/1995 | Fujii et al. | |
| 5,414,299 A | 5/1995 | Wang et al. | |
| 5,417,905 A | 5/1995 | Lemaire et al. | |
| 5,424,576 A | 6/1995 | Djennas et al. | |
| 5,428,248 A | 6/1995 | Cha | |
| 5,432,677 A | 7/1995 | Mowatt et al. | |
| 5,435,057 A | 7/1995 | Bindra et al. | |
| 5,444,301 A | 8/1995 | Song et al. | |
| 5,447,264 A * | 9/1995 | Koopman | B23K 1/0016 228/56.3 |
| 5,452,511 A | 9/1995 | Chang | |
| 5,454,905 A | 10/1995 | Fogelson | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,576,517 A | 11/1996 | Wojnarowski et al. | |
| 5,578,525 A | 11/1996 | Mizukoshi | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,264 A | 3/1997 | Gaul | |
| 5,608,265 A | 3/1997 | Kitano et al. | |
| 5,608,267 A | 3/1997 | Mahulikar et al. | |
| 5,619,068 A | 4/1997 | Benzoni | |
| 5,625,222 A | 4/1997 | Yoneda et al. | |
| 5,627,345 A * | 5/1997 | Yamamoto | H01L 21/76852 174/257 |
| 5,633,528 A | 5/1997 | Abbott et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasarathi | |
| 5,661,088 A | 8/1997 | Tessier et al. | |
| 5,665,996 A | 9/1997 | Williams et al. | |
| 5,673,479 A | 10/1997 | Hawthorne | |
| 5,683,806 A | 11/1997 | Sakumoto et al. | |
| 5,689,135 A | 11/1997 | Ball | |
| 5,696,666 A | 12/1997 | Miles et al. | |

(56) References Cited

U.S. PATENT DOCUMENTS

| | | | |
|---|---|---|---|
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,724,233 A | 3/1998 | Honda et al. | |
| 5,726,493 A * | 3/1998 | Yamashita | H01L 23/3128 257/686 |
| 5,736,432 A | 4/1998 | Mackessy | |
| 5,736,448 A | 4/1998 | Saia et al. | |
| 5,745,984 A | 5/1998 | Cole, Jr. et al. | |
| 5,753,532 A | 5/1998 | Sim | |
| 5,753,977 A | 5/1998 | Kusaka et al. | |
| 5,766,972 A | 6/1998 | Takahashi et al. | |
| 5,769,989 A | 6/1998 | Hoffmeyer et al. | |
| 5,770,888 A | 6/1998 | Song et al. | |
| 5,776,798 A | 7/1998 | Quan et al. | |
| 5,783,861 A | 7/1998 | Son | |
| 5,786,238 A * | 7/1998 | Pai | H05K 3/462 438/118 |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davis et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,841,193 A | 11/1998 | Eichelberger | |
| 5,844,306 A | 12/1998 | Fujita et al. | |
| 5,856,911 A | 1/1999 | Riley | |
| 5,859,471 A | 1/1999 | Kuraishi et al. | |
| 5,859,475 A | 1/1999 | Freyman et al. | |
| 5,866,939 A | 2/1999 | Shin et al. | |
| 5,871,782 A | 2/1999 | Choi | |
| 5,874,770 A * | 2/1999 | Saia | H01L 21/4857 257/359 |
| 5,874,784 A | 2/1999 | Aoki et al. | |
| 5,877,043 A | 3/1999 | Alcoe et al. | |
| 5,886,397 A | 3/1999 | Ewer | |
| 5,886,398 A | 3/1999 | Low et al. | |
| 5,894,108 A | 4/1999 | Mostafazadeh et al. | |
| 5,897,339 A | 4/1999 | Song et al. | |
| 5,900,676 A | 5/1999 | Kweon et al. | |
| 5,903,049 A | 5/1999 | Mori | |
| 5,903,050 A | 5/1999 | Thurairajaratnam et al. | |
| 5,909,053 A | 6/1999 | Fukase et al. | |
| 5,915,998 A | 6/1999 | Stidham et al. | |
| 5,917,242 A | 6/1999 | Ball | |
| 5,937,324 A | 8/1999 | Abercrombie et al. | |
| 5,939,779 A | 8/1999 | Kim | |
| 5,942,794 A | 8/1999 | Okumura et al. | |
| 5,951,305 A | 9/1999 | Haba | |
| 5,959,356 A | 9/1999 | Oh | |
| 5,969,426 A | 10/1999 | Baba et al. | |
| 5,973,290 A * | 10/1999 | Noddin | B23K 26/06 219/121.7 |
| 5,973,388 A | 10/1999 | Chew et al. | |
| 5,976,912 A | 11/1999 | Fukutomi et al. | |
| 5,977,613 A | 11/1999 | Takata et al. | |
| 5,977,615 A | 11/1999 | Yamaguchi et al. | |
| 5,977,630 A | 11/1999 | Woodworth et al. | |
| 5,981,314 A | 11/1999 | Glenn et al. | |
| 5,982,632 A | 11/1999 | Mosley et al. | |
| 5,986,333 A | 11/1999 | Nakamura | |
| 5,986,885 A | 11/1999 | Wyland | |
| 6,001,671 A | 12/1999 | Fjelstad | |
| 6,013,947 A | 1/2000 | Lim | |
| 6,018,189 A | 1/2000 | Mizuno | |
| 6,020,625 A | 2/2000 | Qin et al. | |
| 6,025,640 A | 2/2000 | Yagi et al. | |
| 6,031,279 A | 2/2000 | Lenz | |
| RE36,613 E | 3/2000 | Ball | |
| 6,034,423 A | 3/2000 | Mostafazadeh et al. | |
| 6,040,626 A | 3/2000 | Cheah et al. | |
| 6,043,430 A | 3/2000 | Chun | |
| 6,060,768 A | 5/2000 | Hayashida et al. | |
| 6,060,769 A | 5/2000 | Wark | |
| 6,072,228 A | 6/2000 | Hinkle et al. | |
| 6,075,284 A | 6/2000 | Choi et al. | |
| 6,081,029 A | 6/2000 | Yamaguchi | |
| 6,084,310 A | 7/2000 | Mizuno et al. | |
| 6,087,715 A | 7/2000 | Sawada et al. | |
| 6,087,722 A | 7/2000 | Lee et al. | |
| 6,100,594 A | 8/2000 | Fukui et al. | |
| 6,113,474 A | 9/2000 | Shih et al. | |
| 6,114,752 A | 9/2000 | Huang et al. | |
| 6,118,174 A | 9/2000 | Kim | |
| 6,118,184 A | 9/2000 | Ishio et al. | |
| RE36,907 E | 10/2000 | Templeton, Jr. et al. | |
| 6,130,115 A | 10/2000 | Okumura et al. | |
| 6,130,473 A | 10/2000 | Mostafazadeh et al. | |
| 6,133,623 A | 10/2000 | Otsuki et al. | |
| 6,140,154 A | 10/2000 | Hinkle et al. | |
| 6,143,981 A | 11/2000 | Glenn | |
| 6,165,892 A * | 12/2000 | Chazan | H05K 3/4602 257/E23.172 |
| 6,168,969 B1 * | 1/2001 | Farnworth | H01L 23/481 257/E21.511 |
| 6,169,329 B1 | 1/2001 | Farnworth et al. | |
| 6,177,718 B1 | 1/2001 | Kozono | |
| 6,181,002 B1 | 1/2001 | Juso et al. | |
| 6,184,465 B1 | 2/2001 | Corisis | |
| 6,184,573 B1 | 2/2001 | Pu | |
| 6,194,250 B1 | 2/2001 | Melton et al. | |
| 6,194,777 B1 | 2/2001 | Abbott et al. | |
| 6,197,615 B1 | 3/2001 | Song et al. | |
| 6,198,171 B1 | 3/2001 | Huang et al. | |
| 6,201,186 B1 | 3/2001 | Daniels et al. | |
| 6,201,292 B1 | 3/2001 | Yagi et al. | |
| 6,204,554 B1 | 3/2001 | Ewer et al. | |
| 6,208,020 B1 | 3/2001 | Minamio et al. | |
| 6,208,021 B1 | 3/2001 | Ohuchi et al. | |
| 6,208,023 B1 | 3/2001 | Nakayama et al. | |
| 6,211,462 B1 | 4/2001 | Carter, Jr. et al. | |
| 6,214,525 B1 | 4/2001 | Boyko et al. | |
| 6,218,731 B1 | 4/2001 | Huang et al. | |
| 6,222,258 B1 | 4/2001 | Asano et al. | |
| 6,222,259 B1 | 4/2001 | Park et al. | |
| 6,225,146 B1 | 5/2001 | Yamaguchi et al. | |
| 6,229,200 B1 | 5/2001 | Mclellan et al. | |
| 6,229,205 B1 | 5/2001 | Jeong et al. | |
| 6,239,367 B1 | 5/2001 | Hsuan et al. | |
| 6,239,384 B1 | 5/2001 | Smith et al. | |
| 6,242,281 B1 | 6/2001 | Mclellan et al. | |
| 6,256,200 B1 | 7/2001 | Lam et al. | |
| 6,258,192 B1 | 7/2001 | Natarajan | |
| 6,258,629 B1 | 7/2001 | Niones et al. | |
| 6,261,918 B1 | 7/2001 | So | |
| 6,281,566 B1 | 8/2001 | Magni | |
| 6,281,568 B1 | 8/2001 | Glenn et al. | |
| 6,282,095 B1 | 8/2001 | Houghton et al. | |
| 6,285,075 B1 | 9/2001 | Combs et al. | |
| 6,291,271 B1 | 9/2001 | Lee et al. | |
| 6,291,273 B1 | 9/2001 | Miyaki et al. | |
| 6,294,100 B1 | 9/2001 | Fan et al. | |
| 6,294,830 B1 | 9/2001 | Fjelstad | |
| 6,295,977 B1 | 10/2001 | Ripper et al. | |
| 6,297,548 B1 | 10/2001 | Moden et al. | |
| 6,303,984 B1 | 10/2001 | Corisis | |
| 6,303,997 B1 | 10/2001 | Lee | |
| 6,307,272 B1 | 10/2001 | Takahashi et al. | |
| 6,309,909 B1 | 10/2001 | Ohgiyama | |
| 6,316,822 B1 | 11/2001 | Venkateshwaran et al. | |
| 6,316,838 B1 | 11/2001 | Ozawa et al. | |
| 6,323,550 B1 | 11/2001 | Martin et al. | |
| 6,326,243 B1 | 12/2001 | Suzuya et al. | |
| 6,326,244 B1 | 12/2001 | Brooks et al. | |
| 6,326,678 B1 | 12/2001 | Karnezos et al. | |
| 6,335,564 B1 | 1/2002 | Pour | |
| 6,337,510 B1 | 1/2002 | Chun-Jen et al. | |
| 6,339,255 B1 | 1/2002 | Shin | |

(56) References Cited

U.S. PATENT DOCUMENTS

| | | | |
|---|---|---|---|
| 6,348,726 B1 | 2/2002 | Bayan et al. |
| 6,355,502 B1 | 3/2002 | Kang et al. |
| 6,365,974 B1 | 4/2002 | Abbott et al. |
| 6,369,447 B2 | 4/2002 | Mori |
| 6,369,454 B1 | 4/2002 | Chung |
| 6,373,127 B1 | 4/2002 | Baudouin et al. |
| 6,379,982 B1 | 4/2002 | Ahn et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,396,148 B1 | 5/2002 | Eichelberger et al. |
| 6,396,153 B2 * | 5/2002 | Fillion | H01L 21/4853 257/773 |
| 6,400,004 B1 | 6/2002 | Fan et al. |
| 6,400,573 B1 * | 6/2002 | Mowatt | H01L 23/5383 174/252 |
| 6,406,934 B1 | 6/2002 | Glenn et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,429,509 B1 | 8/2002 | Hsuan |
| 6,437,429 B1 | 8/2002 | Su et al. |
| 6,444,499 B1 | 9/2002 | Swiss et al. |
| 6,448,633 B1 | 9/2002 | Yee et al. |
| 6,448,661 B1 * | 9/2002 | Kim | H01L 23/481 257/686 |
| 6,452,279 B2 | 9/2002 | Shimoda |
| 6,459,148 B1 | 10/2002 | Chun-Jen et al. |
| 6,464,121 B2 | 10/2002 | Reijnders |
| 6,476,469 B2 | 11/2002 | Hung et al. |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,521,530 B2 * | 2/2003 | Peters | H01L 23/49822 257/621 |
| 6,524,885 B2 | 2/2003 | Pierce |
| 6,534,849 B1 | 3/2003 | Gang |
| 6,545,332 B2 | 4/2003 | Huang |
| 6,545,345 B1 | 4/2003 | Glenn et al. |
| 6,559,525 B2 | 5/2003 | Huang |
| 6,566,168 B2 | 5/2003 | Gang |
| 6,573,461 B2 | 6/2003 | Roeters et al. |
| 6,577,013 B1 | 6/2003 | Glenn et al. |
| 6,583,503 B2 | 6/2003 | Akram et al. |
| 6,593,645 B2 * | 7/2003 | Shih | H01L 21/76898 257/686 |
| 6,603,196 B2 | 8/2003 | Lee et al. |
| 6,608,371 B2 | 8/2003 | Kurashima et al. |
| 6,620,731 B1 * | 9/2003 | Farnworth | H01L 21/486 257/E21.511 |
| 6,624,005 B1 | 9/2003 | DiCaprio et al. |
| 6,667,546 B2 | 12/2003 | Huang et al. |
| 6,671,398 B2 | 12/2003 | Reinhorn et al. |
| 6,727,576 B2 | 4/2004 | Hedler et al. |
| 6,730,857 B2 | 5/2004 | Konrad et al. |
| 6,740,964 B2 | 5/2004 | Sasaki |
| 6,780,770 B2 | 8/2004 | Larson |
| 6,831,371 B1 | 12/2004 | Huemoeller et al. |
| 6,838,776 B2 | 1/2005 | Leal et al. |
| 6,845,554 B2 | 1/2005 | Frankowsky et al. |
| 6,853,572 B1 | 2/2005 | Sabharwal |
| 6,873,054 B2 | 3/2005 | Miyazawa et al. |
| 6,905,914 B1 | 6/2005 | Huemoeller et al. |
| 6,919,514 B2 | 7/2005 | Konrad et al. |
| 6,921,975 B2 | 7/2005 | Leal et al. |
| 6,930,256 B1 | 8/2005 | Huemoeller et al. |
| 7,015,075 B2 | 3/2006 | Fay et al. |
| 7,022,609 B2 | 4/2006 | Yamamoto et al. |
| 7,041,534 B2 | 5/2006 | Chao et al. |
| 7,129,158 B2 | 10/2006 | Nakai |
| 7,151,009 B2 | 12/2006 | Kim et al. |
| 7,190,062 B1 | 3/2007 | Sheridan et al. |
| 7,192,807 B1 | 3/2007 | Huemoeller et al. |
| 7,208,838 B2 | 4/2007 | Masuda |
| 7,223,634 B2 | 5/2007 | Yamaguchi |
| 7,242,081 B1 | 7/2007 | Lee |
| 7,247,523 B1 | 7/2007 | Huemoeller et al. |
| 7,272,444 B2 | 9/2007 | Peterson et al. |
| 7,345,361 B2 | 3/2008 | Mallik et al. |
| 7,361,533 B1 | 4/2008 | Huemoeller et al. |
| 7,372,151 B1 | 5/2008 | Fan et al. |
| 7,420,272 B1 | 9/2008 | Huemoeller et al. |
| 7,459,393 B2 * | 12/2008 | Farnworth | H01L 21/561 257/E21.503 |
| 7,531,453 B2 * | 5/2009 | Kirby | H01L 21/76898 257/E21.597 |
| 7,572,681 B1 | 8/2009 | Huemoeller et al. |
| 7,632,753 B1 | 12/2009 | Rusli et al. |
| 7,692,286 B1 | 4/2010 | Huemoeller et al. |
| 7,714,431 B1 | 5/2010 | Huemoeller et al. |
| 7,723,210 B2 | 5/2010 | Berry et al. |
| 7,777,351 B1 | 8/2010 | Berry et al. |
| 7,803,714 B2 * | 9/2010 | Ramiah | H01L 21/3065 257/E21.218 |
| 7,843,052 B1 | 11/2010 | Yoo et al. |
| 7,843,072 B1 * | 11/2010 | Park | H01L 21/76898 257/774 |
| 7,884,016 B2 * | 2/2011 | Sprey | H01L 21/02126 257/E21.597 |
| 7,902,660 B1 | 3/2011 | Lee et al. |
| 7,932,595 B1 | 4/2011 | Huemoeller et al. |
| 7,973,415 B2 | 7/2011 | Kawashita et al. |
| 8,209,856 B2 | 7/2012 | Mori et al. |
| 8,324,511 B1 * | 12/2012 | Huemoeller | H01L 21/6835 174/255 |
| 8,390,130 B1 * | 3/2013 | Hiner | H01L 21/76898 257/621 |
| 8,440,554 B1 * | 5/2013 | Hiner | H01L 21/76898 257/E21.158 |
| 8,487,445 B1 * | 7/2013 | Do | H01L 21/76898 257/773 |
| 2001/0008305 A1 | 7/2001 | McLellan et al. |
| 2001/0011654 A1 | 8/2001 | Schmidt et al. |
| 2001/0012704 A1 | 8/2001 | Eldridge |
| 2001/0014538 A1 | 8/2001 | Kwan et al. |
| 2002/0017710 A1 | 2/2002 | Kurashima et al. |
| 2002/0024122 A1 | 2/2002 | Jung et al. |
| 2002/0027297 A1 | 3/2002 | Ikenaga et al. |
| 2002/0030245 A1 | 3/2002 | Hanaoka et al. |
| 2002/0061642 A1 | 5/2002 | Haji et al. |
| 2002/0081838 A1 * | 6/2002 | Bohr | H01L 21/76898 438/637 |
| 2002/0140061 A1 | 10/2002 | Lee |
| 2002/0140068 A1 | 10/2002 | Lee et al. |
| 2002/0163015 A1 | 11/2002 | Lee et al. |
| 2003/0013232 A1 | 1/2003 | Towle et al. |
| 2003/0030131 A1 | 2/2003 | Lee et al. |
| 2003/0038344 A1 | 2/2003 | Palmer et al. |
| 2003/0064548 A1 | 4/2003 | Isaak |
| 2003/0073265 A1 | 4/2003 | Hu et al. |
| 2003/0085460 A1 | 5/2003 | Siniaguine |
| 2003/0134455 A1 | 7/2003 | Cheng et al. |
| 2003/0207566 A1 | 11/2003 | Forbes et al. |
| 2004/0004293 A1 | 1/2004 | Murayama |
| 2004/0026781 A1 | 2/2004 | Nakai |
| 2004/0046244 A1 | 3/2004 | Nakamura et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0113260 A1 | 6/2004 | Sunohara et al. |
| 2004/0192033 A1 * | 9/2004 | Hara | H01L 21/76898 438/667 |
| 2004/0251554 A1 | 12/2004 | Masuda |
| 2005/0029630 A1 * | 2/2005 | Matsuo | H01L 21/30604 257/628 |
| 2005/0046002 A1 | 3/2005 | Lee et al. |
| 2005/0104181 A1 | 5/2005 | Lee et al. |

(56) References Cited

U.S. PATENT DOCUMENTS

| | | | |
|---|---|---|---|
| 2005/0104228 A1* | 5/2005 | Rigg | H01L 21/76898 257/786 |
| 2005/0242425 A1 | 11/2005 | Leal et al. | |
| 2005/0263869 A1 | 12/2005 | Tanaka et al. | |
| 2005/0282314 A1 | 12/2005 | Lo et al. | |
| 2006/0278979 A1* | 12/2006 | Rangel | H01L 23/481 257/734 |
| 2007/0007639 A1 | 1/2007 | Fukazawa | |
| 2007/0164443 A1 | 7/2007 | Florian et al. | |
| 2007/0273049 A1 | 11/2007 | Khan et al. | |
| 2007/0290376 A1 | 12/2007 | Zhao et al. | |
| 2008/0230887 A1* | 9/2008 | Sun | H01L 21/565 257/686 |
| 2008/0277799 A1 | 11/2008 | Benson et al. | |
| 2009/0020865 A1 | 1/2009 | Su | |
| 2009/0039527 A1* | 2/2009 | Chan | H01L 27/14618 257/777 |
| 2010/0008058 A1 | 1/2010 | Saen et al. | |
| 2010/0059855 A1* | 3/2010 | Lin | H01L 21/565 257/528 |
| 2012/0018868 A1 | 1/2012 | Oganesian et al. | |
| 2012/0175784 A1 | 7/2012 | Lin et al. | |

FOREIGN PATENT DOCUMENTS

| | | |
|---|---|---|
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 3/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |
| JP | 02-129948 | 5/1990 |
| JP | 03-069248 | 7/1991 |
| JP | 03-177060 | 8/1991 |
| JP | 04-098864 | 3/1992 |
| JP | 05-129473 | 5/1993 |
| JP | 05-166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 2000-150765 | 5/2000 |
| JP | 2000-556398 | 10/2000 |
| JP | 2001-060648 | 3/2001 |
| JP | 2002-043497 | 2/2002 |
| KR | 1994-0001979 | 1/1994 |
| KR | 10-0220154 | 6/1999 |
| KR | 2002-0049944 | 6/2002 |
| WO | WO 99/56316 | 11/1999 |
| WO | WO 99/67821 | 12/1999 |

OTHER PUBLICATIONS

Kim et al., "Application of Through Mold Via (TMV) as PoP base package", 58$^{th}$ ECTC Proceedings, May 2008, Lake Buena Vista, FL, 6 pages, IEEE.

Scanlan, "Package-on-package (PoP) with Through-mold Vias", Advanced Packaging, Jan. 2008, 3 pages, vol. 17, Issue 1, PennWell Corporation.

Huemoeller et al., "Integrated Circuit Film Substrate Having Embedded Conductive Patterns and Vias", U.S. Appl. No. 10/261,868, filed Oct. 1, 2002.

Berry et al., "Direct-write Wafer Level Chip Scale Package", U.S. Appl. No. 11/289,826, filed Nov. 29, 2005.

Huemoeller et al., "Embedded Electronic Component Package Fabrication Method", U.S. Appl. No. 12/459,532, filed Jul. 2, 2009.

Berry et al., "Direct-Write Wafer Level Chip Scale Package", U.S. Appl. No. 12/661,597, filed Mar. 19, 2010.

Huemoeller et al., "Through Via Nub Reveal Method and Structure", U.S. Appl. No. 12/754,837, filed Apr. 6, 2010.

Hiner et al., "Through Via Connected Backside Embedded Circuit Features Structure and Method", U.S. Appl. No. 12/848,820, filed Aug. 2, 2010.

Do et al., "Semiconductor Device and Manufacturing Method Thereof", U.S. Appl. No. 12/898,192, filed Oct. 5, 2010.

Hiner et al., "Through Via Recessed Reveal Structure and Method," U.S. Appl. No. 12/985,888, filed Jan. 6, 2011.

\* cited by examiner

THROUGH VIA NUB REVEAL METHOD AND STRUCTURE

RELATED APPLICATIONS

This application is a divisional of Huemoeller et al., U.S. patent application Ser. No. 12/754,837, filed on Apr. 6, 2010, entitled "THROUGH VIA NUB REVEAL METHOD AND STRUCTURE," which is herein incorporated by reference in its entirety.

BACKGROUND OF THE INVENTION

1. Field of the Invention

The present application relates to the field of electronics, and more particularly, to methods of forming electronic component structures.

2. Description of the Related Art

To allow backside contact to an electronic component such as an integrated circuit die, electrically conductive through vias are formed in the electronic component. The through vias extend entirely through the electronic component from the active surface to the inactive surface of electronic component.

The inactive surface of the electronic component is etched to reveal through via nubs, i.e., portions, of the through vias. A chemical vapor deposition (CVD) inorganic dielectric layer such as a plasma enhanced chemical vapor deposition (PECVD) silicon oxide is deposited on the inactive surface of the electronic component and completely encloses the through via nubs. Unfortunately, formation of a CVD inorganic dielectric layer is relatively expensive thus increasing the fabrication cost.

The inorganic dielectric layer is thinned using chemical mechanical polish (CMP) to reveal the ends of the through via nubs. More particularly, the inorganic dielectric layer and a portion of the through via nubs are thinned such that the exposed ends of the through via nubs are parallel to and coplanar with the exterior surface of the inorganic dielectric layer. Unfortunately, chemical mechanical polish is relatively expensive thus increasing the fabrication cost.

SUMMARY OF THE INVENTION

In accordance with one embodiment, a method includes applying a backside passivation layer to an inactive surface of an electronic component and to enclose a through via nub protruding from the inactive surface. The method further includes laser ablating the backside passivation layer to reveal a portion of the through via nub.

In one embodiment, the backside passivation layer is formed of a low cost organic material. By forming the backside passivation layer of an organic material, the fabrication cost is reduced as compared to the formation of a relatively expensive CVD inorganic dielectric layer.

Further, by using a laser ablation process, the backside passivation layer is removed in a controlled manner to reveal the portion of the through via nub. Further, by using a laser ablation process, the resulting thickness of the backside passivation layer is set to a desired value in a controlled manner. Further, by using a laser ablation process, the fabrication cost is reduced as compared to the use of chemical mechanical polish.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 5:
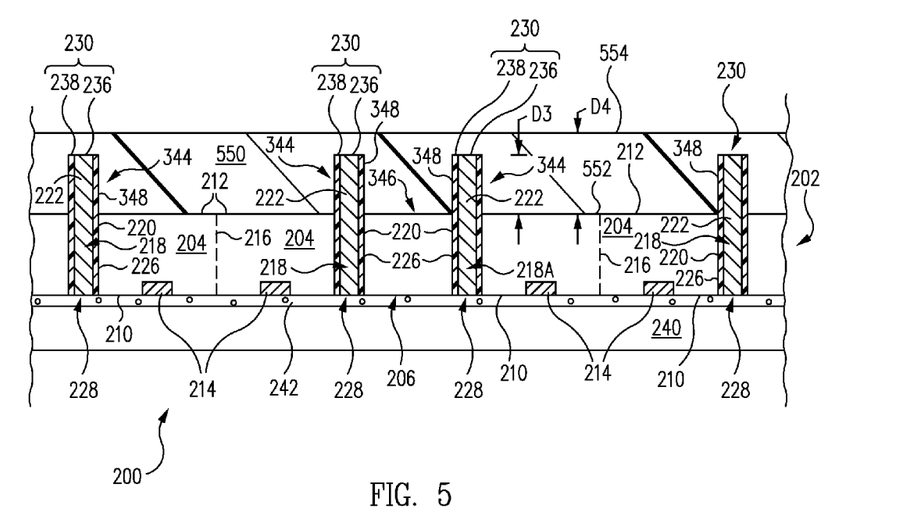
FIG. 5 is a cross-sectional view of the array of FIG. 3 at a later stage during fabrication in accordance with one embodiment.
Figure 6:
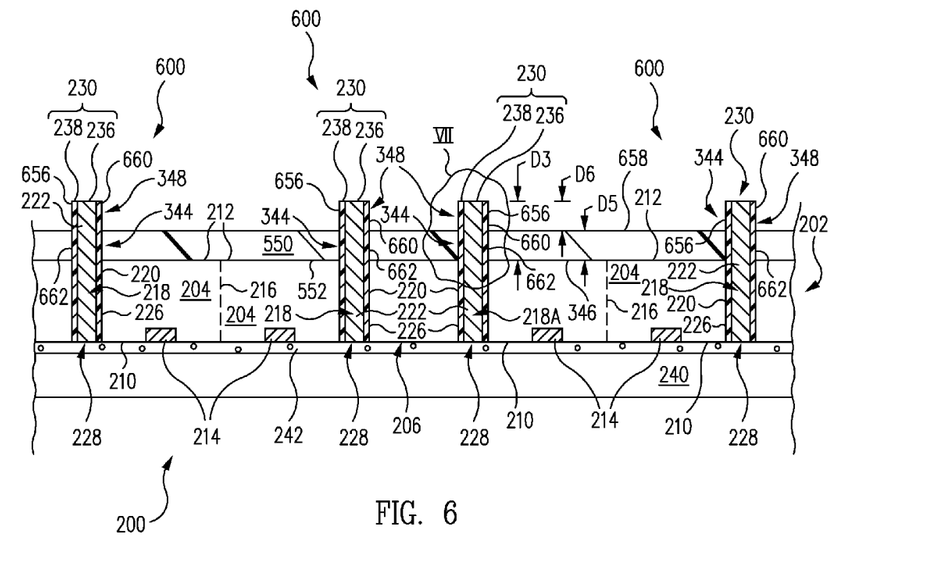
FIG. 6 is a cross-sectional view of the array of FIG. 5 at a later stage during fabrication in accordance with one embodiment.

As an overview and in accordance with one embodiment, referring to FIG. 5, a backside passivation layer 550 is applied to an inactive surface 212 of an electronic component 204 and to enclose through via nubs 344 protruding from inactive surface 212. Referring to FIG. 6, backside passivation layer 550 is laser ablated to reveal top portions 656 of through via nubs 344.

In one embodiment, backside passivation layer 550 is formed of a low cost organic material. By forming backside passivation layer 550 of an organic material, the fabrication cost is reduced as compared to the formation of a relatively expensive CVD inorganic dielectric layer.

Further, by using a laser ablation process, backside passivation layer 550 is removed in a controlled manner to reveal top portions 656 of through via nubs 344. Further, by using a laser ablation process, the resulting thickness of backside passivation layer 550 is set to a desired value in a controlled manner. Further, by using a laser ablation process, the fabrication cost is reduced as compared to the use of chemical mechanical polish.

Figure 1:
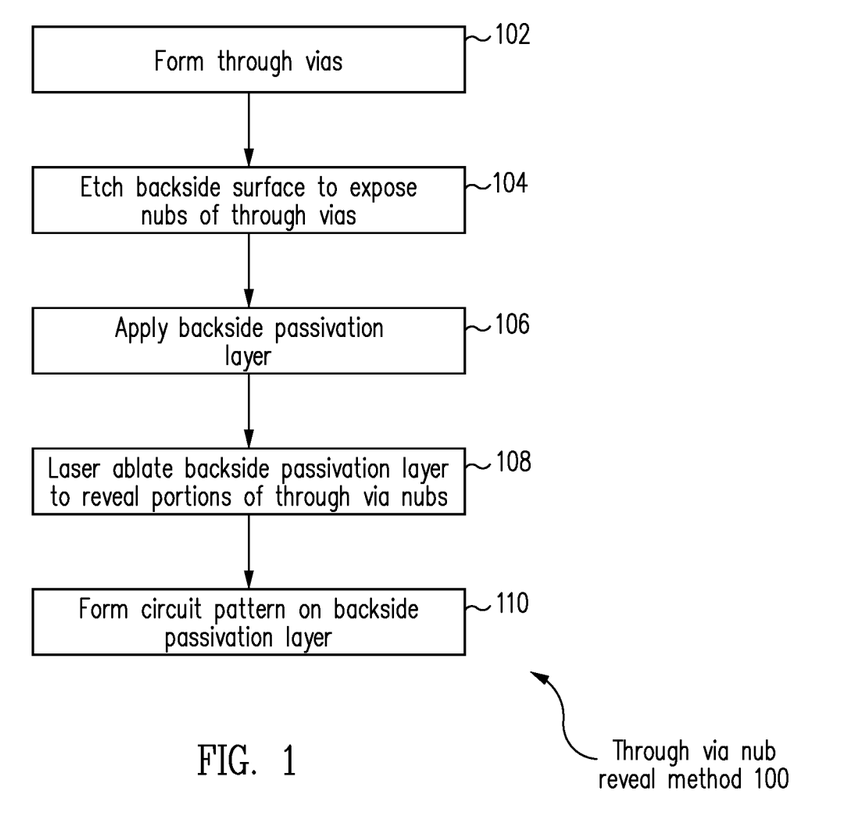
FIG. 1 is a block diagram of a through via nub reveal method in accordance with one embodiment.
Figure 2:
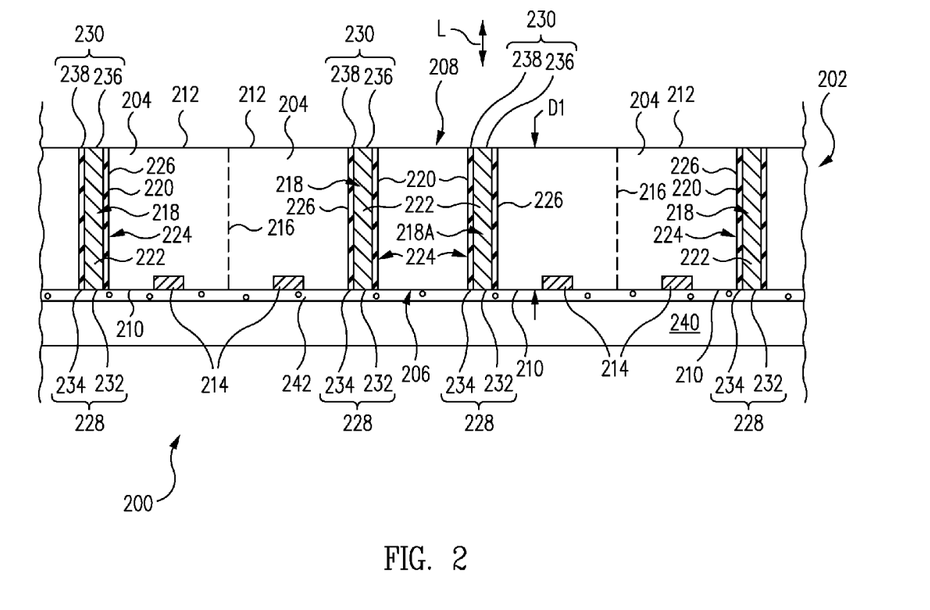
FIG. 2 is a cross-sectional view of an array including a substrate including a plurality of electronic components in accordance with one embodiment.

Now in more detail, FIG. 1 is a block diagram of a through via nub reveal method 100 in accordance with one embodiment. FIG. 2 is a cross-sectional view of an array 200 including a substrate 202 including a plurality of electronic components 204 in accordance with one embodiment.

In one embodiment, substrate 202 is a silicon wafer. Substrate 202 includes a frontside, e.g., first, surface 206 and an opposite backside, e.g., second, surface 208.

Substrate 202 includes electronic components 204 integrally connected to one another. For simplicity, the term substrate 202 shall be used herein and it is to be understood that this term generally includes electronic components 204.

In one embodiment, electronic components 204 are integrated circuit chips, e.g., active components. However, in other embodiments, electronic components 204 are passive components such as capacitors, resistors, or inductors.

In accordance with this embodiment, electronic components 204 include active surfaces 210 and opposite inactive surfaces 212. Active surfaces 210 and inactive surfaces 212 generally define frontside surface 206 and backside surface 208 of substrate 202, respectively. For simplicity, the terms frontside surface 206 and backside surface 208 shall be used herein and it is to be understood that these terms generally include active surfaces 210 and inactive surfaces 212, respectively. Electronic components 204 further includes bond pads 214 formed on active surfaces 210.

Electronic components 204 are delineated from one another by singulation streets 216. Substrate 202 is singulated, e.g., sawed, along singulation streets 216 to separate electronic components 204 from one another at a later stage during fabrication.

Referring now to FIGS. 1 and 2, in a form through vias operation 102, through vias 218 are formed though electronic components 104. Through vias 218 include dielectric through via passivation linings 220 and electrically conductive through via columns 222.

Illustratively, through via apertures 224 are formed, e.g., by laser drilling, into electronic components 104 from frontside surface 206. Through via passivation linings 220, e.g., silicon oxide ($SiO_2$), are formed on the sidewalls of through via apertures 224. In one embodiment, the silicon of substrate 202 exposed within through via apertures 224 is oxidized to form through via passivation linings 220. In another embodiment, a dielectric material is deposited within through via apertures 224 to form through via passivation linings 220. In one embodiment, through via passivation linings 220 are 0.15 μm thick although have other values in other embodiments.

Through via columns 222 are formed within through via passivation linings 220. Illustratively, an electrically conductive material, e.g., copper or tungsten, is deposited, e.g., plated, within through via passivation linings 220 to form through via columns 222. Through via passivation linings 220 electrically isolate through via columns 222 from substrate 202.

Substrate 202 is then thinned, sometimes called backgrinded, to expose through vias 218 at backside surface 208 of substrate 202. In one embodiment, the pitch of through vias 218 is in the range of 10 μm to 30 μm although the pitch has other values in other embodiments.

Through via passivation linings 220 are hollow cylinders and through via columns 222 are solid cylinders formed within through via passivation linings 220.

Through vias 218 are cylindrical in shape although may taper slightly between frontside surface 206 and backside surface 208. More particularly, referring to a first through via 218A of the plurality of through vias 218, through via 218A include a cylindrical outer surface 226, a circular active surface end 228, and a circular inactive surface end 230.

Cylindrical outer surface 226 is defined by the cylindrical outer surface of through via passivation lining 220 of through via 218A. Cylindrical outer surface 226 has a longitudinal axis L perpendicular to frontside surface 206 and backside surface 208. Cylindrical outer surface 226 extends from active surface end 228 to inactive surface end 230. Although the terms parallel, perpendicular, and similar terms are used herein to describe various features, in light of this disclosure, those of skill in the art will understand that the features may not be exactly parallel or perpendicular but only substantially parallel or perpendicular to within accepted manufacturing tolerances.

Active surface end 228 is circular in accordance with this embodiment. Active surface end 228 is coplanar with and parallel to frontside surface 206 of substrate 202.

Active surface end 228 includes a circular active surface column end 232 surrounded by an annular active surface passivation lining end 234. Active surface column end 232 is the lower end of through via column 222 and thus is electrically conductive. Active surface passivation lining end 234 is the lower end of through via passivation lining 220 and thus is a dielectric.

Similarly, inactive surface end 230 is circular in accordance with this embodiment. Inactive surface end 230 is coplanar with and parallel to backside surface 208 of substrate 202.

Inactive surface end 230 includes a circular inactive surface column end 236 surrounded by an annular inactive surface passivation lining end 238. Inactive surface column end 236 is the upper end of through via column 222 and thus is electrically conductive. Inactive surface passivation lining end 238 is the upper end of through via passivation lining 220 and thus is a dielectric.

Although only a single through via 218A is described in detail, in light of this disclosure, those of skill in the art will understand that all of the through vias 218 include cylindrical outer surfaces 226, active surface ends 228, inactive surface ends 230, active surface column ends 232, active surface passivation lining ends 234, inactive surface column ends 236, and inactive surface passivation lining ends 238 in a similar manner.

As illustrated in FIG. 2, frontside surface 206 of substrate 202 is mounted to a carrier 240, e.g., a silicon carrier, by an adhesive 242. In one embodiment, the thickness of carrier 240 is 700 μm although has other values in other embodiments.

Figure 3:
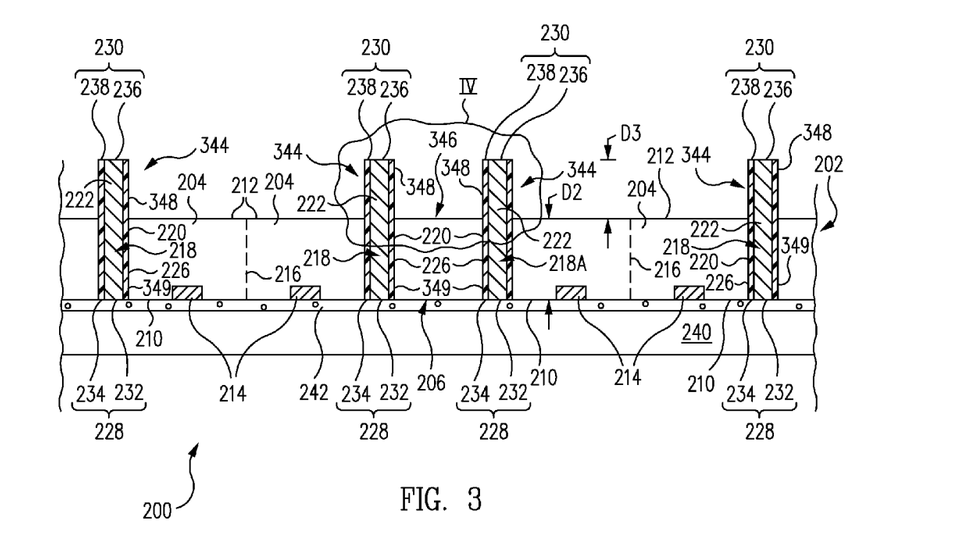
FIG. 3 is a cross-sectional view of the array of FIG. 2 at a later stage during fabrication in accordance with one embodiment.
Figure 4:
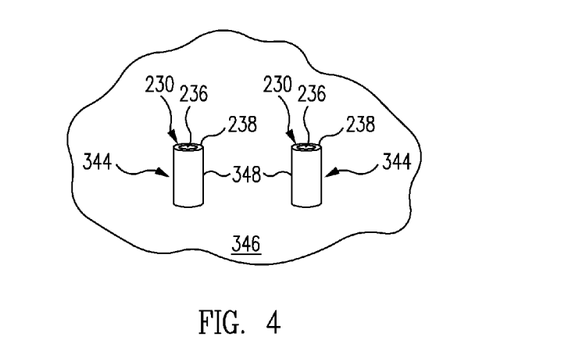
FIG. 4 is a perspective views of the region IV of the array of FIG. 3 in accordance with one embodiment.

FIG. 3 is a cross-sectional view of array 200 of FIG. 2 at a later stage during fabrication in accordance with one embodiment. FIG. 4 is a perspective views of the region IV of array 200 of FIG. 3 in accordance with one embodiment. Referring now to FIGS. 1, 2, 3, and 4 together, from form through vias operation 102, flow moves to an etch backside surface to expose nubs of through vias operation 104.

In etch backside surface to expose nubs of through vias operation 104, backside surface 208 of substrate 202 is blanket etched, i.e., removed, to expose through via nubs 344 of through vias 218. In one embodiment, backside surface 208 is removed using a selective etch that etches substrate 202, e.g., silicon, but does not etch through vias 218, e.g., silicon oxide and copper.

Generally, in etch backside surface to expose nubs of through vias operation 104, substrate 202 is thinned from backside surface 208. Stated another way, a portion of substrate 202 at backside surface 208 as illustrated in FIG. 2 is removed to form a recessed backside surface 346 as illustrated in FIG. 3.

Accordingly, after performance of etch backside surface to expose nubs of through vias operation 104, substrate 102 includes a recessed backside surface 346. Inactive surfaces 212 generally define recessed backside surface 346. For simplicity, the term recessed backside surface 346 shall be used herein and it is to be understood that this term generally include inactive surfaces 212.

The distance D2 between recessed backside surface 346 and frontside surface 206 as illustrated in FIG. 3 is less than the distance D1 between backside surface 208 and frontside surface 206 as illustrated in FIG. 2. Stated another way, substrate 202 is thinned from an initial thickness equal to distance D1 (FIG. 2) to a final thickness equal to distance D2 (FIG. 3).

In one embodiment, distance D1 is 50 μm and distance D2 is 48 μm although distances D1, D2 have other values in other embodiments.

However, through vias 218 are not thinned and thus through via nubs 344 are exposed as illustrated in FIG. 3. Through vias 218 are sometimes said to stand proud of recessed backside surface 346.

Through via nubs 344 are the upper portions of through vias 218 including the upper portions of through via passivation linings 220 and through via columns 222 exposed and uncovered by substrate 202. Through via nubs 344 are cylindrical protrusions protruding upwards from recessed backside surface 346.

Referring again to through via 218A, through via nub 344 includes a cylindrical nub outer surface 348 and inactive surface end 230. Cylindrical nub outer surface 348 is the upper, e.g., first, portion of cylindrical outer surface 226 of through via 218A exposed from substrate 202. A cylindrical enclosed, e.g., second, portion 349 of cylindrical outer surface 226 of through via 218A remains enclosed within and in contact with substrate 202.

Inactive surface end 230 is spaced above recessed backside surface 346. More particularly, a distance D3 exists between inactive surface end 230 and recessed backside surface 346. Distance D3 is equal to the difference between the initial thickness (distance D1 as illustrated in FIG. 2) of substrate 202 prior to performance of etch backside surface to expose nubs of through vias operation 104 and the final thickness (distance D2) of substrate 202 after performance of etch backside surface to expose nubs of through vias operation 104, i.e., D3=D1−D2. In one embodiment, distance D3 is 2 μm although distance D3 has other values in other embodiments.

Although only a single through via 218A is described in detail, in light of this disclosure, those of skill in the art will understand that all of the through vias 218 include through via nubs 344 including cylindrical nub outer surfaces 348 in a similar manner.

FIG. 5 is a cross-sectional view of array 200 of FIG. 3 at a later stage during fabrication in accordance with one embodiment. Referring now to FIGS. 1 and 5 together, from etch backside surface to expose nubs of through vias operation 104, flow moves to an apply backside passivation layer operation 106. In apply backside passivation layer operation 106, a backside passivation layer 550 is applied to recessed backside surface 346 of substrate 202 and through via nubs 344.

Backside passivation layer 550 includes a lower, e.g., first, passivation layer surface 552 attached to recessed backside surface 346. Backside passivation layer 550 further includes an opposite upper, e.g., second, passivation layer surface 554, which is planar. Backside passivation layer 550 is a dielectric material.

In one embodiment, backside passivation layer 550 is formed from an organic material such as polyimide (PI), polybutyloxide (PBO), benzocyclobutene (BCB), a polymer, or other carbon containing material. By forming backside passivation layer 550 of an organic material, the fabrication cost is reduced as compared to the formation of a relatively expensive CVD inorganic dielectric layer. In one embodiment, backside passivation layer 550 is formed by spinning or spraying an organic material onto recessed backside surface 346.

Backside passivation layer 550 has a thickness equal to a distance D4 between lower passivation layer surface 552 and upper passivation layer surface 554. In one embodiment, distance D4 is in the range of 3 μm to 4 μm with a thickness control of ±0.1 μm although distance D4 has other values in other embodiments.

Distance D4 is greater than the distance D3 that through via nubs 344 protrude above recessed backside surface 346. Accordingly, through via nubs 344 including cylindrical nub outer surface 348 and inactive surface ends 230 are completely enclosed within backside passivation layer 550. More particularly, backside passivation layer 550 exists between inactive surface ends 230 of through vias 218 and upper passivation layer surface 554.

FIG. 6 is a cross-sectional view of array 200 of FIG. 5 at a later stage during fabrication in accordance with one embodiment. Referring now to FIGS. 1, 5, and 6 together, from apply backside passivation layer operation 106, flow moves to a laser ablate backside passivation layer to reveal portions of through via nubs operation 108. In laser ablate backside passivation layer to reveal portions of through via nubs operation 108, backside passivation layer 550 is laser ablated to reveal top, e.g., first, portions 656 of through via nubs 344.

In accordance with this embodiment, a laser, e.g., an excimer laser, is directed at upper passivation layer surface 554 of backside passivation layer 550. This laser laser-ablates, i.e., removes, upper passivation layer surface 554 to expose top portions 656 of through via nubs 344 of through vias 218. Upper passivation layer surface 554 is laser-ablated, sometimes call global or mass ablated, while through via nubs 344 are not removed.

In one embodiment, the laser used during the laser ablation process selectively laser-ablates backside passivation layer 550 and does not laser ablate through via nubs 344 even though the laser is directed at through via nubs 344. In another embodiment, the laser used during the laser ablation process is directed only at backside passivation layer 550 to avoid laser ablation of through via nubs 344.

Generally, in laser ablate backside passivation layer to reveal portions of through via nubs operation 108, backside passivation layer 550 is thinned from upper passivation layer surface 554. Stated another way, a portion of backside passivation layer 550 at upper passivation layer surface 554 as illustrated in FIG. 5 is removed to form a recessed upper passivation layer surface 658 as illustrated in FIG. 6.

Accordingly, after performance of laser ablate backside passivation layer to reveal portions of through via nubs operation 108, backside passivation layer 550 includes a recessed upper passivation layer surface 658. The distance D4 between upper passivation layer surface 554 and lower passivation layer surface 552 as illustrated in FIG. 5 is greater than the distance D5 between recessed upper passivation layer surface 658 and lower passivation layer surface 552 as illustrated in FIG. 6. Stated another way, backside passivation layer 550 is thinned from an initial thickness equal to distance D4 (FIG. 5) to a final thickness equal to distance D5 (FIG. 6).

However, through vias 218 are not thinned and top portions 656 of through via nubs 344 are exposed. Top portions 656 of through via nubs 344 are the upper portions of through via nubs 344 including the upper portions of through via passivation linings 220 and through via columns 222 exposed and uncovered by backside passivation layer 550. Top portions 656 of through via nubs 344 are cylindrical protrusions protruding upwards from recessed upper passivation layer surface 658.

Referring again to through via 218A, top portion 656 of through via nub 344 of through via 218A includes a cylindrical top portion outer surface 660 and inactive surface end 230. Cylindrical top portion outer surface 660 is the upper, e.g., first, portion of cylindrical nub outer surface 348 of through via nub 344 of through via 218A exposed from backside passivation layer 550. A cylindrical enclosed, e.g., second, portion 662 of cylindrical nub outer surface 348 of through via nub 344 of through via 218A remains enclosed within and in contact with backside passivation layer 550.

Inactive surface end 230 is spaced above recessed upper passivation layer surface 658. More particularly, a distance D6 exists between inactive surface end 230 and recessed upper passivation layer surface 658. Distance D6 is equal to the difference between the distance D3 which through via nubs 344 protrude above lower passivation layer surface 552 and distance D5 between lower passivation layer surface 552 and recessed upper passivation layer surface 658, i.e., D6=D3−D5.

Although only a single through via 218A is described in detail, in light of this disclosure, those of skill in the art will understand that all of the through vias 218 include top portions 656, cylindrical top portion outer surfaces 660 and cylindrical enclosed portions 662 in a similar manner.

By using a laser ablation process, backside passivation layer 550 is removed in a controlled manner around top portions 656 of through via nubs 344. Further, by using a laser ablation process, the resulting thickness (equal to distance D5) of backside passivation layer 550 is set to a desired value in a controlled manner, e.g., to within +0.1 µm. Further, by using a laser ablation process, the fabrication cost is reduced as compared to the use of chemical mechanical polish.

In one embodiment, any residue on recessed upper passivation layer surface 658 and top portions 656 of through via nubs 344 is removed, e.g., using a soft etch, plasma clean, or combination of these techniques.

Figure 7:
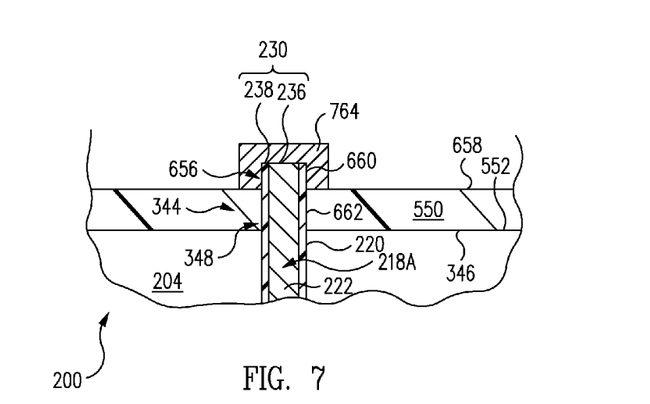
FIG. 7 is a cross-sectional view of the region VII of the array of FIG. 6 at a later stage during fabrication in accordance with one embodiment.

FIG. 7 is a cross-sectional view of the region VII of array 200 of FIG. 6 at a later stage during fabrication in accordance with one embodiment. Referring now to FIGS. 1 and 7 together, from laser ablate backside passivation layer to reveal portions of through via nubs operation 108, flow moves to a form circuit pattern on backside passivation layer operation 110.

In form circuit pattern on backside passivation layer operation 110, an electrically conductive circuit pattern 764 is formed on backside passivation layer 550. More particularly, circuit pattern 764 is formed on recessed upper passivation layer surface 658 of backside passivation layer 550. Backside passivation layer 550 electrically isolates circuit pattern 764 from substrate 202, i.e., from recessed backside surface 346.

Circuit pattern 764 is electrically connected to through vias 218. More particularly, circuit pattern 764 contacts and is electrically connected to inactive surface column ends 236 of through via columns 222 of through vias 218. As top portions 656 of through via nubs 344 protrude above recessed upper passivation layer surface 658, electrical interconnection between circuit pattern 764 and through vias 218 is facilitated.

In one embodiment, circuit pattern 764 includes terminals and/or traces. Illustratively, a terminal, sometimes called pad, provides an electrically conductive area to which other electrical conductors, e.g., solder balls, are mounted. A trace is a long yet narrow electrical conductor extending in a horizontal direction substantially parallel to recessed upper passivation layer surface 658 that electrically interconnects other electrical conductors, e.g., terminals of circuit pattern 764, with one another. Although terminals and traces are set forth as examples of features of circuit pattern 764, in light of this disclosure, those of skill in the art will understand that circuit pattern 764 is formed with other electrically conductive features in other embodiments depending upon the particular application.

Figure 8:
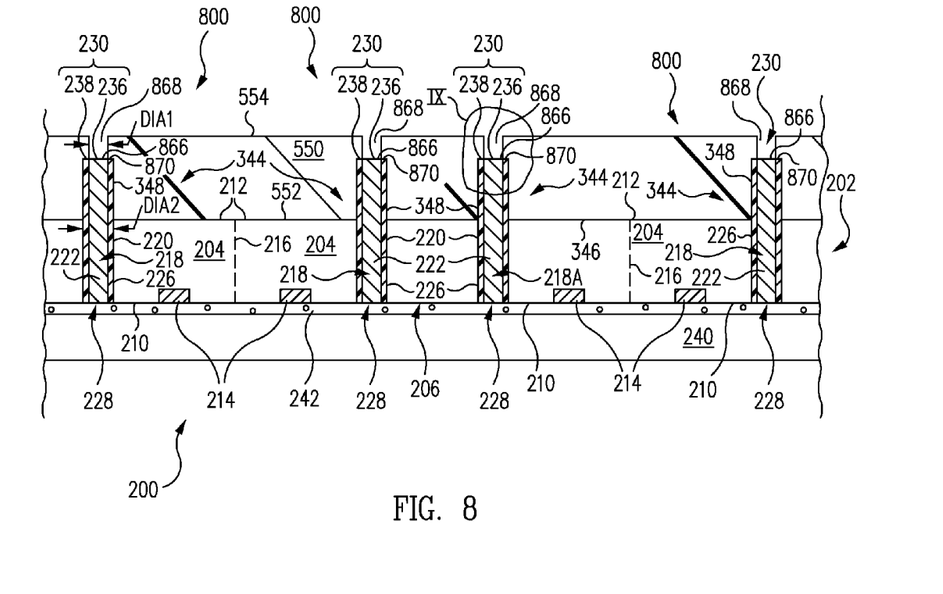
FIG. 8 is a cross-sectional view of the array of FIG. 5 at a later stage during fabrication in accordance with another embodiment.

FIG. 8 is a cross-sectional view of array 200 of FIG. 5 at a later stage during fabrication in accordance with another embodiment. Referring now to FIGS. 1, 5, and 8 together, from apply backside passivation layer operation 106, flow moves to laser ablate backside passivation layer to reveal portions of through via nubs operation 108. In laser ablate backside passivation layer to reveal portions of through via nubs operation 108, backside passivation layer 550 is laser ablated to reveal contact area, e.g., first, portions 866 of inactive surface ends 230 of through via nubs 344.

In accordance with this embodiment, a laser is directed at upper passivation layer surface 554 of backside passivation layer 550. This laser laser-ablates, i.e., removes, selective portions of upper passivation layer surface 554 to reveal contact area portions 866 of inactive surface ends 230 of through via nubs 344 of through vias 218. Upper passivation layer surface 554 is laser-ablated, i.e., removed, while through via nubs 344 are not removed.

Generally, in laser ablate backside passivation layer to reveal portions of through via nubs operation 108, circuit pattern apertures 868 are formed in backside passivation layer 550 to expose contact area portions 866 of inactive surface ends 230 of through via nubs 344 of through vias 218. Circuit pattern apertures 868 extend between upper passivation layer surface 554 and contact area portions 866. Circuit pattern apertures 868 have a diameter DIA1 less than a diameter DIA2 of through vias 218. In one embodiment, diameter DIA2 of through vias 218 is less than or equal to 20 µm, e.g., is in the range of 5 µm to 10 µm, although diameter DIA2 has other values in other embodiments.

Accordingly, contact area portions 866 of inactive surface ends 230 are the portions of inactive surface ends 230 exposed and uncovered by circuit pattern apertures 868. Further, enclosed area, e.g., second, portions 870 of inactive surface ends 230 of through via nubs 344 of through vias 218 remain enclosed within and covered by backside passivation layer 550.

In one embodiment, contact area portions 866 are inactive surface column ends 236 of through via columns 222 of through vias 218. The accordance of this embodiment, enclosed area portions 870 are inactive surface passivation lining ends 238 of through via passivation linings 220 of through vias 218.

In light of this disclosure, those of skill in the art will understand that in various embodiments a contact area portion 866 includes (1) a portion of inactive surface column end 236 only; (2) the entire inactive surface column end 236; (3) the entire inactive surface column end 236 and a portion of inactive surface passivation lining end 238; or (4) a portion of inactive surface column end 236 and a portion of inactive surface passivation lining end 238, depending upon the diameter of the circuit pattern aperture 868 and the tolerance in alignment of the circuit pattern aperture 868 with the through via 218.

By using a laser ablation process, circuit pattern apertures 868 are formed in backside passivation layer 550 in a controlled manner to expose contact area portions 866 of through via nubs 344. Further, by using a laser ablation process, the fabrication cost is reduced as compared to the use of chemical mechanical polish.

Figure 9:
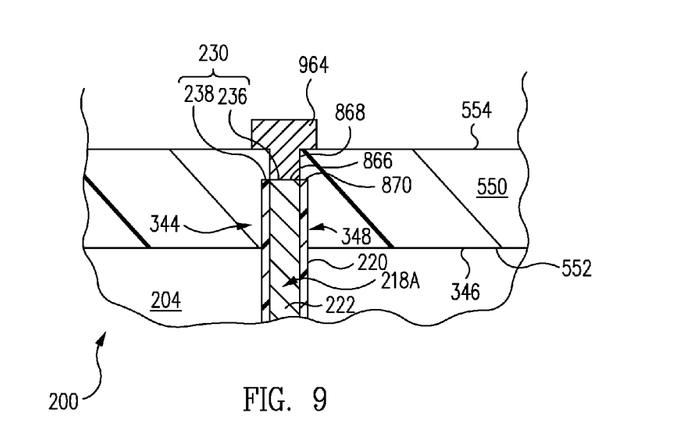
FIG. 9 is a cross-sectional view of the region IX of the array of FIG. 8 at a later stage during fabrication in accordance with one embodiment.

FIG. 9 is a cross-sectional view of the region IX of array 200 of FIG. 8 at a later stage during fabrication in accordance with one embodiment. Referring now to FIGS. 1 and 8 together, from laser ablate backside passivation layer to reveal portions of through via nubs operation 108, flow moves to form circuit pattern on backside passivation layer operation 110.

In form circuit pattern on backside passivation layer operation 110, an electrically conductive circuit pattern 964 is formed on backside passivation layer 550. More particularly, circuit pattern 964 is formed on upper passivation layer surface 554 and within circuit pattern apertures 868 of backside passivation layer 550. Backside passivation layer 550 electrically isolates circuit pattern 964 from substrate 202, i.e., from recessed backside surface 346.

Circuit pattern 964 is electrically connected to through vias 218. More particularly, circuit pattern 964 contacts and is electrically connected to contact area portions 866 of through vias 218.

In one embodiment, circuit pattern 964 includes terminals and/or traces in a manner similar to that described above regarding circuit pattern 764 of FIG. 7 and so is not repeated here.

Referring again to FIGS. 6 and 8, array 200 is singulated on singulation streets 216 to form a plurality of individual electronic component packages 600, 800, respectively. More particularly, substrate 202 and backside passivation layer 550 are cut, e.g., using a laser, mechanical sawing, or other singulation technique to form electronic component packages 600, 800. However, in other embodiments, array 200 is singulated at later stages during manufacture.

Although formation of a plurality of electronic component packages 600, 800 simultaneously in array 200 is described above, in other embodiments, electronic component 204 are processed individually (after singulation of substrate 202) using the methods as described above.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of manufacturing an electronic component having at least one through via nub, the method comprising:
   forming a through via that extends through a semiconductor die, where the semiconductor die comprises an active surface and an inactive surface;
   filling the through via with conductive material;
   etching the inactive surface of the semiconductor die to expose a through via nub of the conductive material protruding from the inactive surface;
   after said etching, applying a backside passivation layer to the inactive surface of the semiconductor die and thereby enclosing the protruding through via nub; and
   ablating the backside passivation layer thereby revealing a portion of the through via nub.

2. A method of manufacturing an electronic component having at least one through via nub, the method comprising:
   applying a backside passivation layer to an inactive surface of a semiconductor die that comprises the inactive surface and an active surface opposite the inactive surface, wherein the backside passivation layer has a first thickness greater than a distance that a through via nub protrudes from the inactive surface; and
   thinning the backside passivation layer to a second thickness less than the distance that the through via nub protrudes from the inactive surface.

3. The method of claim 2 wherein the applying comprises applying the backside passivation layer to the inactive surface and to the through via nub, such that the backside passivation layer completely encloses the through via nub.

4. The method of claim 2 wherein said thinning the backside passivation layer to a second thickness comprises thinning the entire backside passivation layer.

5. The method of claim 2, comprising after at least said thinning, singulating the semiconductor die from a wafer.

6. The method of claim 2 wherein:
   the through via nub comprises a top surface and a cylindrical side surface that protrude from the inactive surface of the semiconductor die; and
   after said thinning, a first portion of the cylindrical side surface is covered by the backside passivation layer and a second portion of the cylindrical side surface is exposed from the backside passivation layer.

7. The method of claim 4, wherein said thinning comprises laser ablating the backside passivation layer.

8. The method of claim 5 wherein said laser ablating comprises directing a laser at the backside passivation layer and the through via nub, the laser selectively laser ablating the backside passivation layer and not the through via nub.

9. The method of claim 5 wherein said laser ablating comprises directing a laser at the backside passivation layer, but not at the through via nub.

10. The method of claim 2, wherein the backside passivation layer is organic.

* * * * *